6/26/84 XR 4,456,849

United States Patent [19]

Takayama et al.

[11] 4,456,849

[45] Jun. 26, 1984

[54] PIEZOELECTRIC ULTRASONIC TRANSDUCER WITH DAMPED SUSPENSION

[75] Inventors: Ryoichi Takayama, Suita; Akira Tokushima, Kyoto; Nozomu Ueshiba, Neyagawa; Yukihiko Ise, Toyonaka, all of Japan

[73] Assignee: Matsushita Electric Industrial Co., Ltd., Kadoma, Japan

[21] Appl. No.: 418,839

[22] Filed: Sep. 16, 1982

[30] Foreign Application Priority Data

Sep. 22, 1981 [JP] Japan ................................ 56-150288

[51] Int. Cl.[3] ................................................ H01L 41/08

[52] U.S. Cl. .................................... 310/324; 310/322; 179/110 A

[58] Field of Search ........................ 310/322, 324, 326; 179/110 A

[56] References Cited

U.S. PATENT DOCUMENTS

| | | | |
|---|---|---|---|
| 3,253,674 | 5/1966 | Desmares | 310/322 |
| 3,360,664 | 12/1967 | Straube . | |
| 3,439,128 | 4/1969 | Sobel et al. | 179/110 A |
| 3,749,854 | 7/1973 | Mifune et al. . | |
| 3,786,202 | 1/1974 | Schafft | 310/322 |
| 4,011,473 | 3/1977 | Massa . | |
| 4,337,640 | 7/1982 | Muranaka et al. | 310/322 X |
| 4,368,400 | 1/1983 | Taniguchi et al. | 310/322 |

FOREIGN PATENT DOCUMENTS

| | | | |
|---|---|---|---|
| 53947A1 | 6/1982 | European Pat. Off. . | |
| 1301808 | 7/1962 | France . | |
| WO82/00543 | 2/1982 | PCT Int'l Appl. | 310/324 |

*Primary Examiner*—Mark O. Budd

*Attorney, Agent, or Firm*—Cushman, Darby & Cushman

[57] ABSTRACT

An ultrasonic transducer comprises a lamination structured piezo-electric element (1) to which center shaft (2) of a diaphragm (3) is connected, a housing (7) mounted integral with a horn (11), a buffer member (10) disposed between said housing (7) and said diaphragm (3) for holding said diaphragm (3) in vibratable manner; thereby a sharp rise up and fall down characteristics of ultrasonic wave and sharp directivity are attained.

13 Claims, 12 Drawing Figures

PIEZOELECTRIC ULTRASONIC TRANSDUCER WITH DAMPED SUSPENSION

BACKGROUND OF THE INVENTION

1. Field of the Invention

The present invention relates to an improvement in an ultrasonic transducer using a laminated piezo-electric element and more particularly to an ultrasonic transducer with improved directivity characteristics and improved transient characteristics (pulse characteristics).

2. Description of the Prior Art

Ultrasonic transducer for use in the air has been proposed and includes laminated piezo-electric ceramic elements which are designed to work at resonance point or anti-resonance point. Further, since the mechanical impedance of air is very smaller than that of the piezo-electric ceramic element, the laminated element is connected to a diaphragm for attaining mechanical impedance matching therebetween.

In video camera having automatic focussing mechanism for its objective lens by means of ultrasonic distance measurement, the measurement must be continuously made. Such continuous measurement requires a good transient characteristic in order to avoid error of measurement. For such good transient measurement, short rise up and falling down time are necessary. On the other hand, in such video camera uses zoom lens as objective lens, and distance measurement for such zoom lens must be made with a sharp directivity corresponding to narrowest picture angle of the zoom lens.

Hitherto, ceramic ultrasonic transducer is known as the apparatus of a high sensitivity, high durability against moisture or acidic or salty atmosphere and high S/N ratio due to its resonance characteristic. But the ceramic ultrasonic transducer has had bad transient characteristic due to its very high mechanical Q value.

A typical example of conventional ultrasonic transducer is shown in FIG. 1, which is a sectional elevation view along its axis. As shown in FIG. 1, a lower end of a coupling shaft 2 is fixed passing through a central portion of a laminated piezo-electric element 1 with the upper part secured to a diaphragm 3. The laminated piezo-electric element 1 such as a ceramic piezo-electric element is mounted at positions of nodes of oscillation via a flexible adhesive 5 on tips of supports 4. Lead wires 9,9' of the laminated piezo-electric element is connected to terminals 6,6' secured to base 71 of a housing 7, which has a protection mesh 8 at the opening thereof.

FIG. 2 is a graph showing envelope of radiated ultrasonic wave transmitted when the transducer is supplied with the ultrasonic wave during the time of 0 to 2 m sec of time graduated on the abscissa. As is observed in FIG. 2, the response of the transducer, i.e., the rise time and fall time are relatively long, both being of the order of 2 m sec. When data signal is sent and received by use of such ultrasonic transducer, time density of the data, or data transmission speed is limited by such relatively long rise time and fall time. If a high density data signal is sent and received via such transducer, for example, in ultrasonic wave distance measurement, data become mixed with the tailing part of the preceding data. Accordingly accurate sending and receipt of data is not attained.

Furthermore, when it is intended to obtain a sharp directivity with such device as shown in FIG. 1, use of larger laminated piezo-electric element 1, larger diaphragm 3, and larger supports 4 must be made much large, and pure piston disc motion of such large diaphragm, if used, become hard to realize. Therefore, sharp directivity has been hard to realize. When, in order to attain a sharp directivity, a horn is intended to be combined to such apparatus with large components, then, improvement of the transient characteristic through lowering of the mechanical Q value of the ultrasonic vibration system becomes difficult.

SUMMARY OF THE INVENTION

Therefore the purpose of the present invention is to provide an improved ultrasonic transducer wherein both sharp directivity and high sensitivity are obtainable without losing the sharp transient characteristic, thereby a high speed data sending and receiving or ultrasonic distance measurement in a very short time is attainable.

DESCRIPTION OF THE PREFERRED EMBODIMENT

Figure 1:
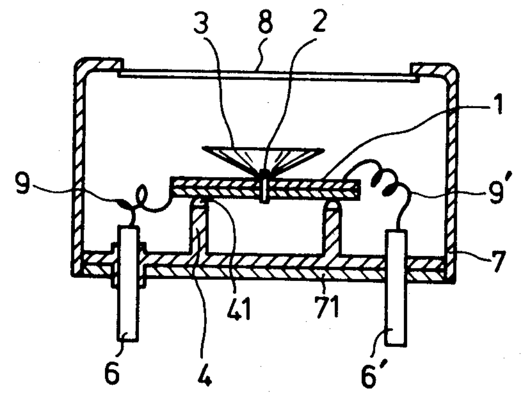
FIG.1 (Prior Art)
FIG. 1 is the sectional elevation view of the conventional ultrasonic transducer.
Figure 2:
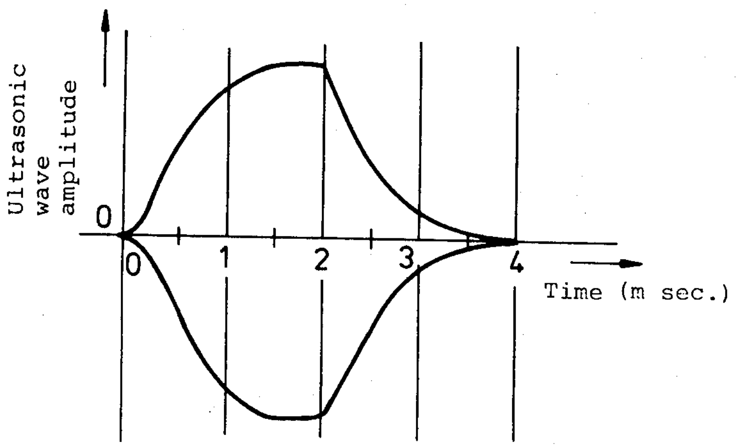
FIG.2 (Prior Art)
FIG. 2 is the graph of the envelope of ultrasonic wave radiation showing the transient characteristic of the transducer shown in FIG. 1.
Figure 3:
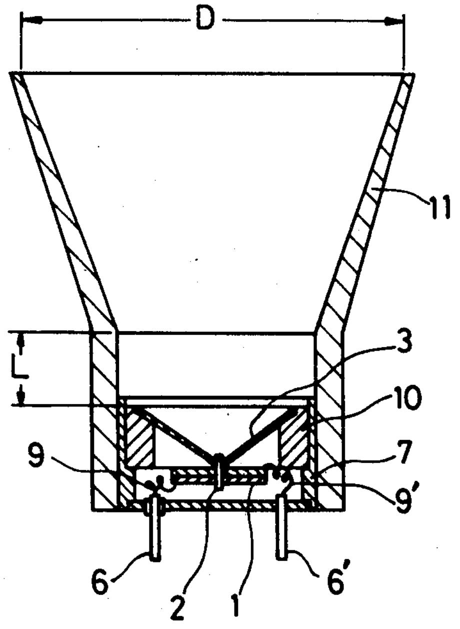
FIG. 3 is a sectional elevation view of an example embodying the present invention.

FIG. 3 is a sectional elevation view at the axis of an example embodying the present invention. As shown in FIG. 3, a lower end of a coupling shaft 2 is fixed passing through a central portion of a laminated piezo-electric element 1 with the upper part secured to a diaphragm 3 of metal or resin. Peripheral end part of the diaphragm 3 is held by an inner end of a ring shaped buffer member 10 of elastic and vibration absorbing substance, such as rubber or silicone rubber, and the outer face of the buffer member 10 is fixed to the inner wall of the cylindrical housing 7 of hard plastic or metal. By bonding the periphery of the diaphragm 3 onto the upper face of the buffer member 10, the space on the front face side of the diaphragm is isolated from the space of the rear face side of the diaphragm 3. The housing 7 is further fixed to the inner face of a horn 11 at the bottom part thereof.

The horn 11 is made of metal or a hard plastic, and the housing 7 is fixed by force fit, or alternatively, the housing 7 and the horn 11 may be formed continuously and integrally with the same material. Anyway, the housing and the horn should be mechanically integral with each other. The housing 7 has two terminals 6, 6' to which lead wires 9, 9' from the laminated piezo-electric element 1 is connected. Bonding of the buffer member 10 to the housing 7 and bonding of the diaphragm to the buffer member 10 are made preferably with an electrically conductive bond in order to discharge undesirable electric charges due to ultrasonic vibration.

The details of the example apparatus are as follows:

| | |
|---|---|
| diameter of the laminated piezo-electric element 1 | 10 mm |
| substance of the laminated piezo-electric element | $PbTiO_3.PbZrO_3.Pb(Mg_{1/3}Nb_{2/3})O_3$-mixed crystal |
| diameter of the diaphagm 3 | 17 mm |
| substance of the diaphragm 3 | Al 0.1 mm thick |
| top angle of the cone of the diaphragm 3 | 112° |
| diameter of the opening of the horn 11 | 55 mm |
| substance of the horn | ABS resin |
| shape of the horn is | conical horn with cylindrical throat part |
| driving ultrasonic frequency | about 50-70 KHz depending on thickness of piezo-electric element. |

Figure 4:
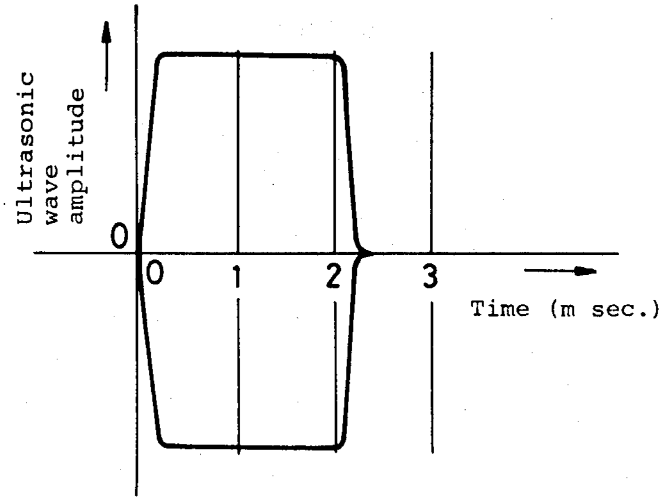
FIG. 4 is a graph of an envelope of ultrasonic wave radiation showing the transient characteristic of the transducer shown in FIG. 3.

Transient characteristic of the ultrasonic transducer is satisfactory as shown by FIG. 4 which is a graph of envelope curve of ultrasonic radiation when the ultrasonic transducer of FIG. 3 is driven by an ultrasonic signal for a period of 0 m sec to 2 m sec.

As shown by FIG. 4, the rise and fall transient time is only less than 0.15 m sec.

Figure 5A:
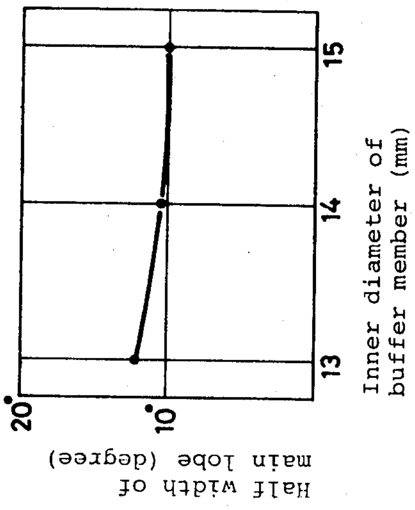
FIG. 5(*a*) and FIG. 5(*b*) are graphs of relations between inner diameter of the buffer member 10 of the apparatus of FIG. 3 and half acoustic pressure angle (directivity) and rise time, respectively.
Figure 5B:
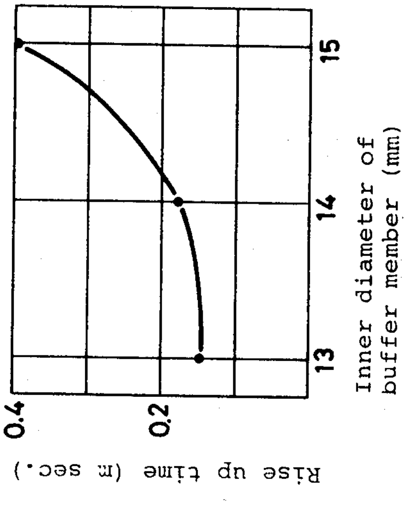

FIG. 5(*a*) and FIG. 5(*b*) show relations of inner diameter (in mm) of the buffer member 10 vs. half width of main lobe (in degree) of the directivity curve and rise time (in m sec) i.e., transient characteristic, respectively, of the example of FIG. 3. As shown in FIG. 5(*a*) and FIG. 5(*b*), it is understood that as the inner diameter decreases the rise time become shorter but the half width of the main lobe increases. When the inner diameter is made far smaller, the side lobes of the directivity curve also increase. From many experiments, it is found that the inner diameter of the buffer member 10 should be 80% to 85% of that of the diaphragm in order to obtain desirable half width of main lobe as well as desirable rise time.

Figure 6A:
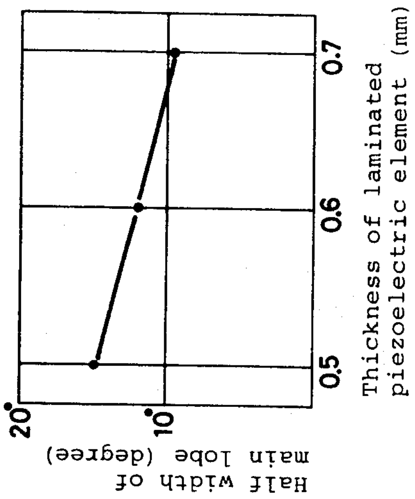
FIG. 6(*a*) and FIG. 6(*b*) are graphs of relations between sizes of a laminated piezo-electric element 10 of the apparatus of FIG. 3 and half acoustic pressure angle and rise time (transient time), respectively.
Figure 6B:
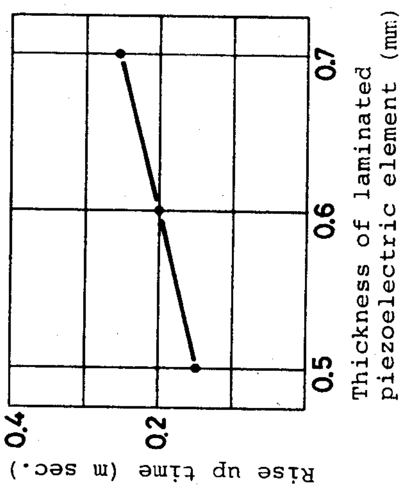

FIG. 6(*a*) and FIG. 6(*b*) show relation of thickness of laminated piezo-electric element 1 vs. half width of main lobe (in degree) of the directivity curve and rise time (in m sec) i.e., transient characteristic, respectively, of the above-mentioned example. As shown in FIG. 6(*a*) and FIG. 6(*b*), as the thickness of the laminated piezo-electric element increases, the rise time becomes longer and also the half width of main lobe increases. Of course, as the thickness decreases, the driving frequency becomes higher.

Figure 7:
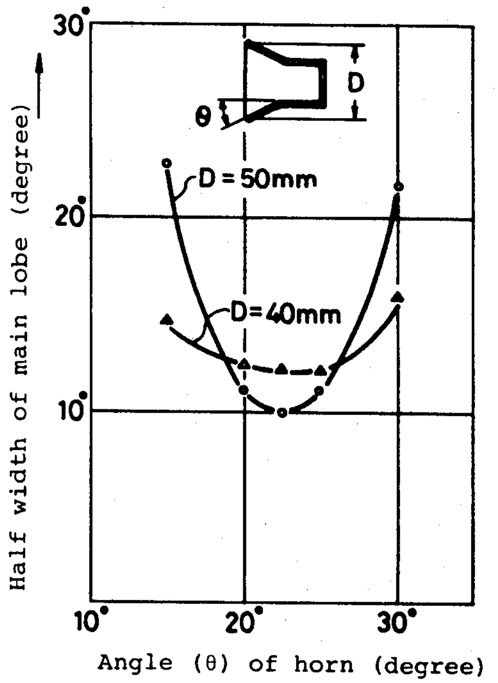
FIG. 7 is a graph of relation between aperture angle of a horn and half acoustic pressure angle.
Figure 8:
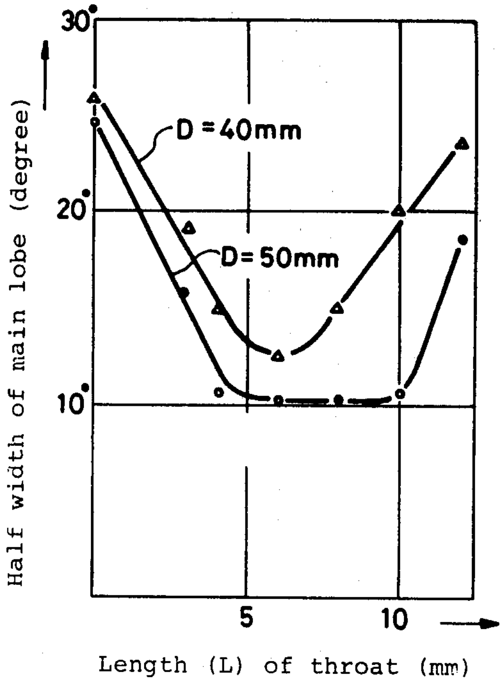
FIG. 8 is a graph of relation between length of wave-guide part and the half acoustic pressure angle.

FIG. 7 and FIG. 8 show relations of the half width of main lobe (degree) vs. angle $\theta$ of horn (degree) and length L of throat (mm), respectively, shown in FIG. 3. The second example apparatus used for the experiments is as follows:

| | |
|---|---|
| diameter of the laminated piezo-electric element 1 | 10 mm |
| thickness of the laminated piezo-electric element 1 | 0.6 mm |
| substance of the laminated piezo-electric element 1 | $PbTiO_3.PbZrO_3.Pb(Mg_{1/3}Nb_{2/3})O_3$-mixed crystal |
| diameter of the diaphragm 3 | 17 mm |
| substance of the diaphragm 3 | Al 0.1 mm thick |
| inner diameter of the buffer member 10 | 13 mm |
| substance of the buffer member 10 | silicone rubber |
| driving ultrasonic frequency | about 50-70 KHz. |

As shown in FIG. 7, for both of horns of the diameters D of opening of 40 mm and 50 mm, the directivity is the best when the angle $\theta$ is about 23°, and for desirable directivity the angle $\theta$ should be between 20° and 26°.

FIG. 8 shows that optimum directivities are obtainable, at the throat length L of 4-8 mm for the horn of 40 mm opening diameter D and at 5-10 mm for the horn of 50 mm opening diameter D. Experiments show that throat length L of 10-20% of the horn opening diameter D is preferable.

Figure 9:
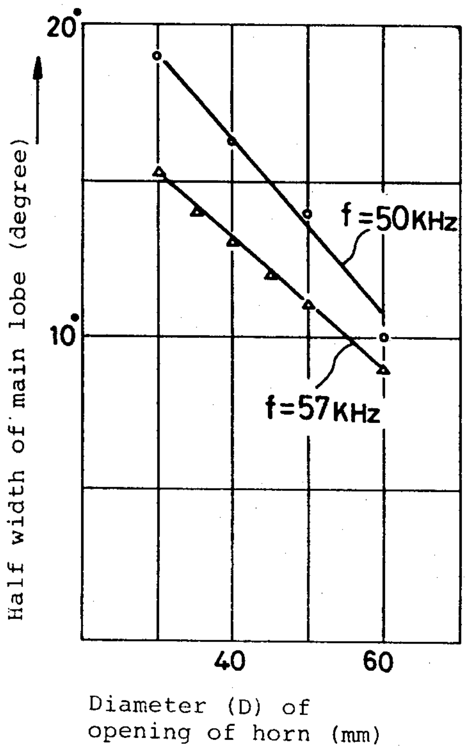
FIG. 9 is a graph of relation between inner diameter of opening of the horn and the half acoustic pressure angle.

FIG. 9 shows relation of diameter D of opening of the horn 11 vs. half width of main lobe (degree) of the above-mentioned second example, wherein parameter is driving frequency f. FIG. 9 shows that the larger diameter D produces better directivity.

Figure 10:
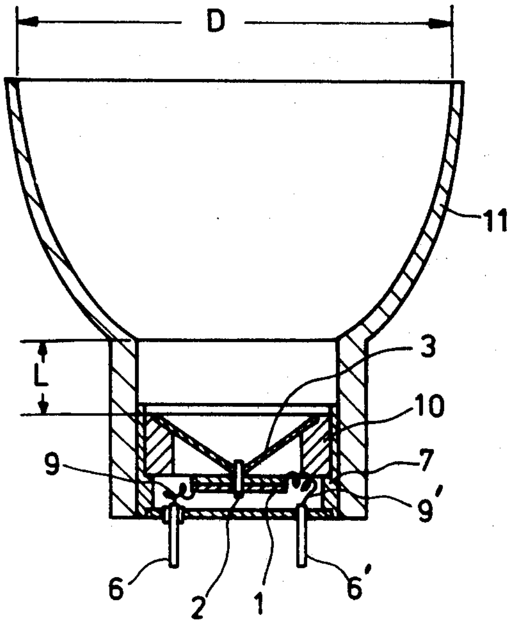
FIG. 10 is a sectional elevation view of another example embodying the present invention.

Instead of the above-mentioned conical shape horn 11, a parabola-shaped horn as shown in FIG. 10 is also effective in the same manner.

As has been elucidated in detail citing much experimental data, the ultrasonic transducer embodying the present invention is characterized by acoustically integral structure of the housing 7 and horn 11 and peripheral holding of the diaphragm by the ring-shaped buffer member 10 of resilient and absorbing substance fixed with its outer face to the housing 7, thereby isolating the rear side space of the diaphragm from the front side space in the horn of the diaphragm. Such characterized configuration produces a synergistic effect which results in compatibility of good directivity and good transient characteristic at the same time. Therefore, the ultrasonic transducer of the present invention is useful when used in continuous distance measuring apparatus for movie camera or TV camera, and especially suitable for use in cameras for video tape recorder wherein very quick distance measuring is required with a very high directivity corresponding to use of automatic zoom objective lens.

What is claimed is:

1. An ultrasonic transducer for transmitting and receiving ultrasonic waves comprising:
   - a piezo-electric laminated type ceramic element,
   - a diaphragm composed of metal, connected at its substantial center to the substantial center of said piezo-electric element for ultrasonic transmission in air and ultrasonic reception from air,
   - a connection pin for attaching said element to said diaphragm, said piezo-electric element being mechanically supported solely by said connection pin,
   - a housing for containing said piezo-electric element and said diaphragm therein,
   - a horn provided integral with said housing and having a throat part of a cylindrical inside space wherein said piezo-electric element and said diaphragm are disposed, a tubular shaped buffer means fixed to an inner wall of said housing for holding the peripheral part of said diaphragm and for damping the mechanical vibrations of said diaphragm, said buffer means bonded to an inside wall of said housing by an electrically conductive adhesive, and said diaphragm bonded to said buffer member by an electrically conductive adhesive, said horn defining a horn part of parabola shape extending from a throat part of cylindrical space, said diaphragm being cone shaped and said laminated type piezo-electric element being disk shaped, the diameter of said cone shaped diaphragm being larger than the diameter of said laminated type piezo-electric element, so that said diaphragm is held at its peripheral part thereof on an end face of said tubular shaped buffer means while said piezo-electric element is disposed in said tubular shaped buffer means with its peripheral part free from the inside wall of said tubular shaped buffer means.

2. An ultrasonic transducer in accordance with claim 1, wherein said diaphragm means comprises a cone shaped hollow body and said element means comprises a laminated type piezo-electric disk-shaped element.

3. An ultrasonic transducer in accordance with claim 1, wherein diameter of said cone shaped diaphragm is larger than diameter of said laminated type piezo-electric element.

4. An ultrasonic transducer in accordance with claim 1, wherein said horn means has a wall defining a substantially-cylindrical hollow.

5. An ultrasonic transducer in accordance with claim 1, wherein said housing means and said horn means are integral to one another.

6. An ultrasonic transducer in accordance with claim 1, wherein said buffer means is bonded by an electrically conductive adhesive to said housing means and said diaphragm means is bonded by an electrically conductive adhesive to said buffer means.

7. An ultrasonic transducer in accordance with claim 1, wherein said horn means has a wall defining a truncated hollow cone extending from a substantially cylindrical hollow.

8. An ultrasonic transducer in accordance with claim 1, wherein said horn means has a wall defining a hollow parabola extending from a substantially cylindrical hollow.

9. An ultrasonic transducer in accordance with either of claim 2 to 8, wherein said element means comprises a laminated type ceramic piezo-electric element.

10. An ultrasonic transducer in accordance with either of claim 2 to 8, wherein inner diameter of said buffer means is 80–85% of diameter of said diaphragm means.

11. An ultrasonic transducer for transmitting and receiving ultrasonic waves comprising:

a piezo-electric laminated type ceramic element, a diaphragm composed of metal, connected at its substantial center to the substantial center of said piezo-electric element, for ultrasonic transmission in air and ultrasonic reception from air, a connection pin for attaching said element to said diaphragm, said piezo-electric element being mechanically supported solely by said connection pin, a housing for containing said piezo-electric element and said diaphragm therein, a horn provided integral with said housing and having a throat part of a cylindrical inside space wherein said piezo-electric element and said diaphragm are disposed, a tubular shaped buffer means fixed to an inner wall of said housing for holding the peripheral part of said diaphragm, and for damping the mechanical vibrations of said diaphragm;

said buffer means being bonded to an inside wall of said housing by an electrically conductive adhesive, and said diaphragm is bonded to said buffer member by an electrically conductive adhesive;

said horn defining a horn part of truncated cone shape extending from a throat part of cylindrical space;

said diaphragm being cone shaped and said laminated type piezo-electric element being disk shaped; and the diameter of said cone shaped diaphragm being larger than the diameter of said laminated type piezo-electric element, so that said diaphragm is held at its peripheral part thereof on an end face of said tubular shaped buffer means while said piezo-electric element is disposed in said tubular shaped buffer means with its peripheral part free from the inside wall of said tubular shaped buffer means.

12. An ultrasonic transducer for transmitting and receiving acoustical signals comprising:

piezo-electric element means for converting between said acoustical signals and electrical signals;

diaphragm means connected to the substantial center of said element means for transmitting said acoustical signals to and from said element means and for supporting said element means;

housing means for housing said element and said diaphragm means; and buffer means fixed to said housing means for supporting said diaphragm means and for damping mechanical vibrations produced in said diaphragm means by said acoustical signals.

13. An ultrasonic transducer as in claim 12 further comprising horn means connected to said housing means for increasing the directionality and the sensitivity of said transducer.

* * * * *